(12) United States Patent
Yu

(10) Patent No.: US 7,424,280 B2
(45) Date of Patent: Sep. 9, 2008

(54) FREQUENCY SYNTHESIZER AND FREQUENCY SYNTHESIS METHOD

(75) Inventor: Hwa-Yeal Yu, Bucheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 541 days.

(21) Appl. No.: 11/206,014

(22) Filed: Aug. 17, 2005

(65) Prior Publication Data

US 2006/0046663 A1 Mar. 2, 2006

(30) Foreign Application Priority Data

Aug. 30, 2004 (KR) ............. 10-2004-0068789

(51) Int. Cl.
*H04B 7/00* (2006.01)
(52) U.S. Cl. .............. 455/258; 455/76; 455/260; 331/34; 331/1 R
(58) Field of Classification Search ........... 455/76, 455/118, 255, 256, 257, 258, 259, 260, 265; 331/1 R, 2, 18, 34
See application file for complete search history.

(56) References Cited

U.S. PATENT DOCUMENTS

| | | | | |
|---|---|---|---|---|
| 5,834,987 A * | 11/1998 | Dent | ........................ | 332/127 |
| 6,047,029 A | 4/2000 | Eriksson | ..................... | 375/247 |
| 6,094,569 A | 7/2000 | Wang | ........................ | 455/313 |
| 6,226,499 B1 * | 5/2001 | Nakatani et al. | .............. | 455/78 |
| 6,392,493 B1 | 5/2002 | Minnis | ........................ | 331/1 |
| 6,542,044 B1 * | 4/2003 | Berquist et al. | ............. | 331/176 |
| 6,754,508 B1 * | 6/2004 | Pau | ........................ | 455/552.1 |
| 7,292,832 B2 * | 11/2007 | Ferguson, Jr. | ............... | 455/260 |
| 2001/0036817 A1 * | 11/2001 | Yamada et al. | .............. | 455/260 |
| 2003/0176173 A1 * | 9/2003 | Klemmer | ................. | 455/182.2 |
| 2005/0250464 A1 * | 11/2005 | Spencer et al. | ............. | 455/260 |
| 2005/0266805 A1 * | 12/2005 | Jensen | ........................ | 455/82 |

FOREIGN PATENT DOCUMENTS

| | | |
|---|---|---|
| JP | 2003-046389 | 2/2003 |
| KR | 1999-0074953 | 5/1999 |
| WO | WO 95/12243 | 4/1995 |

* cited by examiner

*Primary Examiner*—Blane J Jackson
(74) *Attorney, Agent, or Firm*—F. Chau & Associates, LLC

(57) ABSTRACT

A dual frequency synthesizer includes a reference oscillator, an R counter, a first fractional-N phase-locked loop (for a receiving channel) and a second fractional-N phase-locked loop (for a transmitting channel) and one shared sigma-delta modulator. The reference oscillator outputs a reference oscillation frequency clock. The R counter outputs a reference frequency clock based on the reference oscillation frequency clock. The first fractional-N phase-locked loop (PLL) (for a receiving channel) generates a first (receiving channel frequency) clock based on the reference frequency clock. The second fractional-N phase-locked loop (for a transmitting channel) generates a second (transmitting channel frequency) clock based on the same reference frequency clock. Both fractional-N phase-locked loops share a common sigma-delta modulator. Therefore, the chip size of the dual frequency synthesizer may be reduced.

27 Claims, 7 Drawing Sheets

FIG. 4

| CHANNEL NUMBER | TRANSMITTING CHANNEL FREQUENCY [MHz] | RECEIVING CHANNEL FREQUENCY [MHz] | N | M | fracRx=fracTx |
|---|---|---|---|---|---|
| 0 | 1850 | 1930 | 578 | 603 | 0.125 |
| 1 | 1850.05 | 1930 | 578 | 603 | 0.140625 |
| 2 | 1930.1 | 1930 | 578 | 603 | 0.15625 |
| 3 | 1930.15 | 1930 | 578 | 603 | 0.171875 |
| ... | ... | ... | ... | ... | ... |
| 599 | 1879.95 | 1959.95 | 587 | 612 | 0.484375 |
| 600 | 1880 | 1960 | 587 | 612 | 0.5 |
| 601 | 1880.05 | 1960.05 | 587 | 612 | 0.515625 |
| ... | ... | ... | ... | ... | ... |
| 1198 | 1909.90 | 1989.90 | 596 | 621 | 0.84375 |
| 1199 | 1909.95 | 1989.95 | 596 | 621 | 0.859375 |

FIG. 5

| CHANNEL NUMBER | TRANSMITTING CHANNEL FREQUENCY [MHz] | RECEIVING CHANNEL FREQUENCY [MHz] | N | M | fracRx=fracTx |
|---|---|---|---|---|---|
| 1 | 825.03 | 870.03 | 1375 | 1450 | 0.05 |
| 2 | 825.06 | 870.06 | 1375 | 1450 | 0.1 |
| 3 | 825.09 | 870.09 | 1375 | 1450 | 0.15 |
| ⋮ | ⋮ | ⋮ | ⋮ | ⋮ | ⋮ |
| 362 | 835.86 | 880.86 | 1393 | 1468 | 0.1 |
| 363 | 835.89 | 880.89 | 1393 | 1468 | 0.15 |
| 364 | 835.92 | 880.92 | 1393 | 1468 | 0.2 |
| ⋮ | ⋮ | ⋮ | ⋮ | ⋮ | ⋮ |
| 1022 | 855.66 | 900.66 | 1426 | 1501 | 0.1 |
| 1023 | 855.69 | 900.69 | 1426 | 1501 | 0.15 | form and function to analogous elements of a general (integer-N) phase-locked loop. The fractional-N phase-locked loop further includes an N' counter 104, an N' decoder 105 and a sigma-delta modulator 106.

FREQUENCY SYNTHESIZER AND FREQUENCY SYNTHESIS METHOD

CLAIM FOR PRIORITY

This application claims priority under 35 USC § 119 to Korean Patent Application No. 2004-68789, filed on Aug. 30, 2004, the contents of which are herein incorporated by reference in their entirety for all purposes.

BACKGROUND OF THE INVENTION

1. Field of the Invention

The invention relates to frequency synthesizers and methods of synthesizing frequencies in a wireless communication system, and more particularly to a dual frequency synthesizer included in a transceiver having a single shared sigma-delta modulator and methods of synthesizing a frequency using the same.

2. Description of the Related Art

In wireless communication systems, frequency synthesizers for obtaining (channel) frequencies necessary for a transmitter and a receiver are necessary. Each frequency synthesizer uses a phase-locked loop (PLL) to generate a desired channel frequency by way of comparing a signal of a reference frequency with a divided frequency signal (which is an oscillation frequency of a voltage controlled oscillator (VCO) that is divided at a necessary frequency divide ratio).

Phase-locked loops used in frequency synthesis methods can be an integer-N type or a fractional-N type.

The integer-N type method, in which the oscillation frequency of the voltage controlled oscillator is divided by an integer division ratio, has a drawback in that the resolution of the phase-locked loop is constrained to be an integer-N times the reference frequency. In the integer-N type phase-locked loop, the reference frequency must be small so as to achieve a desired fine frequency resolution. This obstructs the use of a high loop bandwidth. There is a degradation of locking time of the phase-locked because the loop bandwidth and locking time of the phase-locked loop have an inversely proportional relationship to each other.

On the other hand, the fractional-N type method is capable of dividing the oscillation frequency of the voltage controlled oscillator by a divide ratio having a fractional value. Accordingly, it can be advantageous in the locking time of the phase-locked loop because a high reference frequency can be used and thus the high loop bandwidth can be chosen. Also, by increasing the reference frequency, the fractional-N type has an advantage with respect to in-band noise. This is particularly true, in a wireless communication system having a relatively narrow channel bandwidth such as a wireless communication system using a code division multiple access (CDMA) technology. Thus, the fractional-N type method in which the reference frequency is not limited by the channel bandwidth is essential to such a wireless communication system.

In addition, the fractional-N type PLL employs the method of continuously switching the divide ratio to predetermined integer values to obtain a desired average divide ratio so that a desired non-integer (fractional) divide ratio may be achieved. A sigma-delta modulator configured to perform noise-shaping is used to remove spurious noise, by continuously switching the divide ratio with a pseudo-random modulation.

FIG. 1 is a block diagram illustrating a conventional fractional-N phase-locked loop.

Referring to FIG. 1, the fractional-N phase-locked loop includes a phase detector PD 101, a loop filter 102 and a voltage controlled oscillator VCO 103 that are similar in form and function to analogous elements of a general (integer-N) phase-locked loop. The fractional-N phase-locked loop further includes an N' counter 104, an N' decoder 105 and a sigma-delta modulator 106.

The division ratio of the fractional-N phase-locked loop is represented by the sum of an integer division ratio N and a fractional division ratio Fract that is between zero and one. The integer division ratio N is inputted to the N' decoder 105 and the fractional division ratio Fract is inputted to the sigma-delta modulator 106. The sigma-delta modulator 106 may include a multilevel adder and a latch that operate in synchronization with an output clock of the N' counter 104 to output an add signal or a subtract signal to the N' decoder 105.

The N' decoder 105 decodes the add signal or the subtract signal outputted from the sigma-delta modulator 106 to add or subtract a predetermined value from the integer division ratio N, and generates an integer division ratio N'. The N' counter 104 receives the integer division ratio N', which varies in predetermined sequences, from the N' decoder 105, and based on the integer division ratio N', the N' decoder 105 divides an output clock of the voltage controlled oscillator VCO 103. Thus, on average, the fractional-N phase-locked loop performs a fractional-N division operation.

Although the fractional-N phase-locked loop has some advantages as mentioned above, the fractional-N phase-locked loop has the disadvantage of a larger chip size because the sigma-delta modulator included in the fractional-N phase-locked loop has a relatively large area on the chip.

FIG. 2 is a block diagram illustrating a conventional dual frequency synthesizer 200 using two conventional fractional-N phase-locked loops and two sigma-delta demodulators.

Referring to FIG. 2, the conventional dual frequency synthesizer 200 includes a first phase-locked loop Rx PLL 210 and a first sigma delta modulator 218 (for a receiving channel) and a second phase-locked loop Tx PLL 250 and a second sigma delta modulator 258 (for a transmitting channel).

The phase-locked loop Rx PLL 210 for the receiving channel includes a temperature compensation crystal oscillator TCXO 211, an R counter 212, a phase detector and charge pump PFD/CP 213, a loop filter LPF 214, a voltage controlled oscillator 215, an N' counter 216, an N' decoder 217 and a sigma-delta modulator 218.

Similarly, the phase-locked loop Tx PLL 250 for the transmitting channel includes a temperature compensation crystal oscillator TCXO 251, an R counter 252, a phase detector and charge pump PFD/CP 253, a loop filter LPF 254, a voltage controlled oscillator 255, an N' counter 256, an N' decoder 257 and a sigma-delta modulator 258.

Although it is illustrated that the PLLs (Rx PLL and Tx PLL) for the receiving and transmitting channels have separate temperature compensation crystal oscillators TCXO in FIG. 2, the temperature compensation crystal oscillator TCXO may be shared by the two PLLs in common in an typical application.

As shown in FIG. 2, two sigma-delta modulators 218 and 258 are used for the fractional-N frequency synthesizer because each PLL for the receiving and transmitting channels operates independently, resulting in an increase in chip size. Each sigma-delta modulator takes up about one third of the chip size of the frequency synthesizer so that the fractional-N frequency synthesizer has a increased chip size compared with the integer-N frequency synthesizer.

SUMMARY OF THE INVENTION

Exemplary embodiments of the invention provide a dual frequency synthesizer and a method of synthesizing at least two frequencies (e.g., two frequencies in a transceiver), in which an R counter and a sigma-delta modulator are shared by two fractional-N PLLs (phase locked loops), for receiving and transmitting channels, resulting in reduced chip size.

In some embodiments of the invention, there is provided a (dual) frequency synthesizer (e.g., for use in a transceiver), which includes a first fractional-N phase-locked loop (PLL) (for a receiving channel) and a second fractional-N phase-locked loop (PLL) (for a transmitting channel) that share a common sigma-delta modulator. The (dual) frequency synthesizer may further include a shared reference oscillator, and a shared R counter. The reference oscillator generates a reference oscillation frequency clock. The R counter outputs a reference frequency clock based on the reference oscillation frequency clock. The first fractional-N phase-locked loop (PLL) (for the receiving channel) generates a first (e.g., receiving channel) frequency clock based on the reference frequency clock. The second fractional-N phase-locked loop (for the transmitting channel) generates a second (e.g., transmitting channel) frequency clock based on the same reference frequency clock. The fractional division ratios for the first and second fractional-N phase-locked loops are set equal to each other. The first and second fractional-N phase-locked loops therefore can share a common sigma-delta modulator receiving the common fractional division ratio.

In one exemplary embodiment, the dual frequency synthesizer further includes an inverter configured to invert the reference clock provided from the R counter, wherein the reference clock is provided to one of the fractional-N phase-locked loop (e.g., for the receiving channel) and the inverted clock is provided to a other fractional-N phase-locked loop (e.g., the phase-locked loop for the transmitting channel). This reduces noise.

In one mode, the dual frequency synthesizer is adapted for a CDMA US-PCS transceiver and the variable R of the R counter is set to 6 and the reference oscillation frequency of the reference oscillator is about 19.2 MHz.

In another mode, the frequency synthesizer is adapted for a CDMA cellular transceiver and the variable R of the R counter is 16 and the reference oscillation frequency of the reference oscillator is about 19.2 MHz.

In other exemplary embodiments of the invention, there is provided of a method of synthesizing two frequencies (e.g., in a transceiver), which includes generating a first (e.g., receiving channel) frequency based on a reference frequency clock, a first fractional division ratio and a first integer division ratio; and generating a second (e.g., transmitting channel) frequency based on the same reference frequency clock, a second fractional division ratio and a second integer division ratio, wherein the first fractional division ratio is substantially the same as the second fraction division ratio. The method may further include generating a reference frequency based on a reference oscillation frequency clock and a (R) count value.

In still other exemplary embodiments of the invention, there is provided of a fractional-N (dual) frequency synthesizer, which includes an oscillator, a counter, a first fractional-N phase-locked loop (PLL) (for a receiving channel), a second fractional-N phase-locked loop (PLL) (for a transmitting channel) and a shared sigma-delta modulator. The counter generates a reference frequency based on a first integer division ratio data and an output frequency clock of the oscillator. The first fractional-N phase-locked loop generates a first (e.g., a receiving channel) frequency based on the reference frequency clock, a second integer division ratio data and an add/subtract signal (from the shared sigma-delta modulator). The second fractional-N phase-locked loop generates a second (e.g., transmitting channel) frequency based on the same reference frequency clock, a third integer division ratio data and the same add/subtract signal. The second (transmitting) frequency has a predetermined frequency difference Δf from the first (receiving) channel frequency. The sigma-delta modulator generates the add/subtract signal based on a common fractional division ratio data.

In one exemplary embodiments, the first fractional-N phase-locked loop (PLL) configured to generate the first (e.g., receiving channel) frequency includes a phase detector/charge pump (configured to generate a phase detection signal based on the reference frequency clock and an internal clock), a loop filter (configured to generate a control voltage signal based on the phase detection signal); a voltage controlled oscillator (configured to generate the first frequency clock based on the control voltage signal); a decoder configured to generate an integer division ratio based on the second integer division ratio data and the add/subtract signal; and a counter configured to generate the internal clock based on the first frequency clock and the integer division ratio of the decoder, wherein the sigma-delta modulator is synchronized with the internal clock.

BRIEF DESCRIPTION OF THE DRAWINGS

The invention will become more apparent to those of ordinary skill in the art by describing, in detail, exemplary embodiments thereof with reference to the attached drawings, wherein like elements are represented by like reference numerals, and which are given by way of illustration only and thus do not limit the scope of the invention:

FIG. 4 is a table showing exemplary integer and fractional division ratios employed in a CDMA-based US-PCS communication system according to an embodiment of the invention;

FIG. 5 is a table showing exemplary integer and fractional division ratios employed in a CDMA-based cellular communication system according to an embodiment of the invention;

DESCRIPTION OF THE EXEMPLARY EMBODIMENTS OF THE INVENTION

Figure 3:
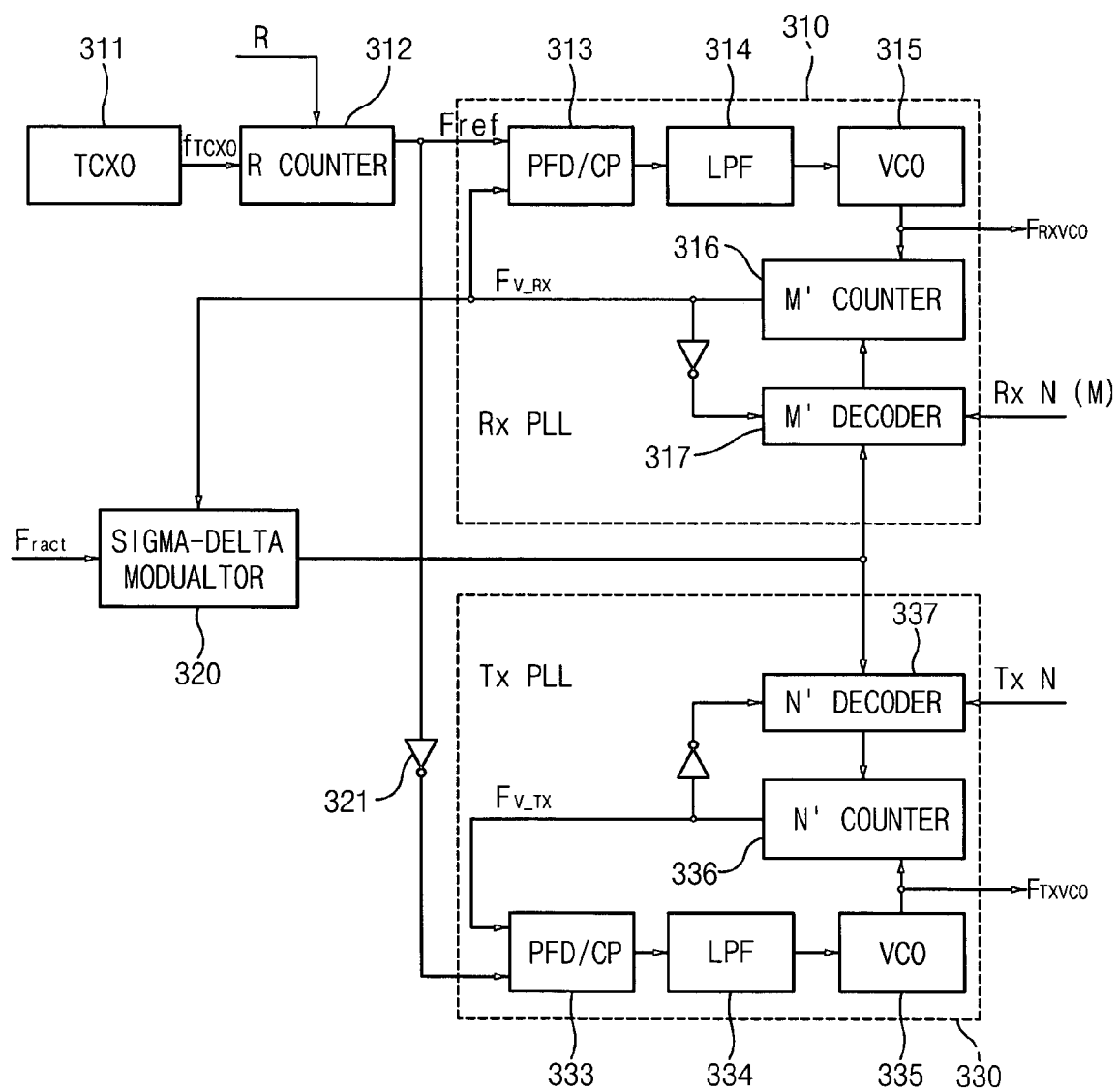
FIG. 3 is a block diagram illustrating a (dual) frequency synthesizer including only one shared sigma-delta demodulator according to an embodiment of the invention.

FIG. 3 is a block diagram illustrating a (dual) frequency synthesizer according to an exemplary embodiment of the invention.

Figure 2:
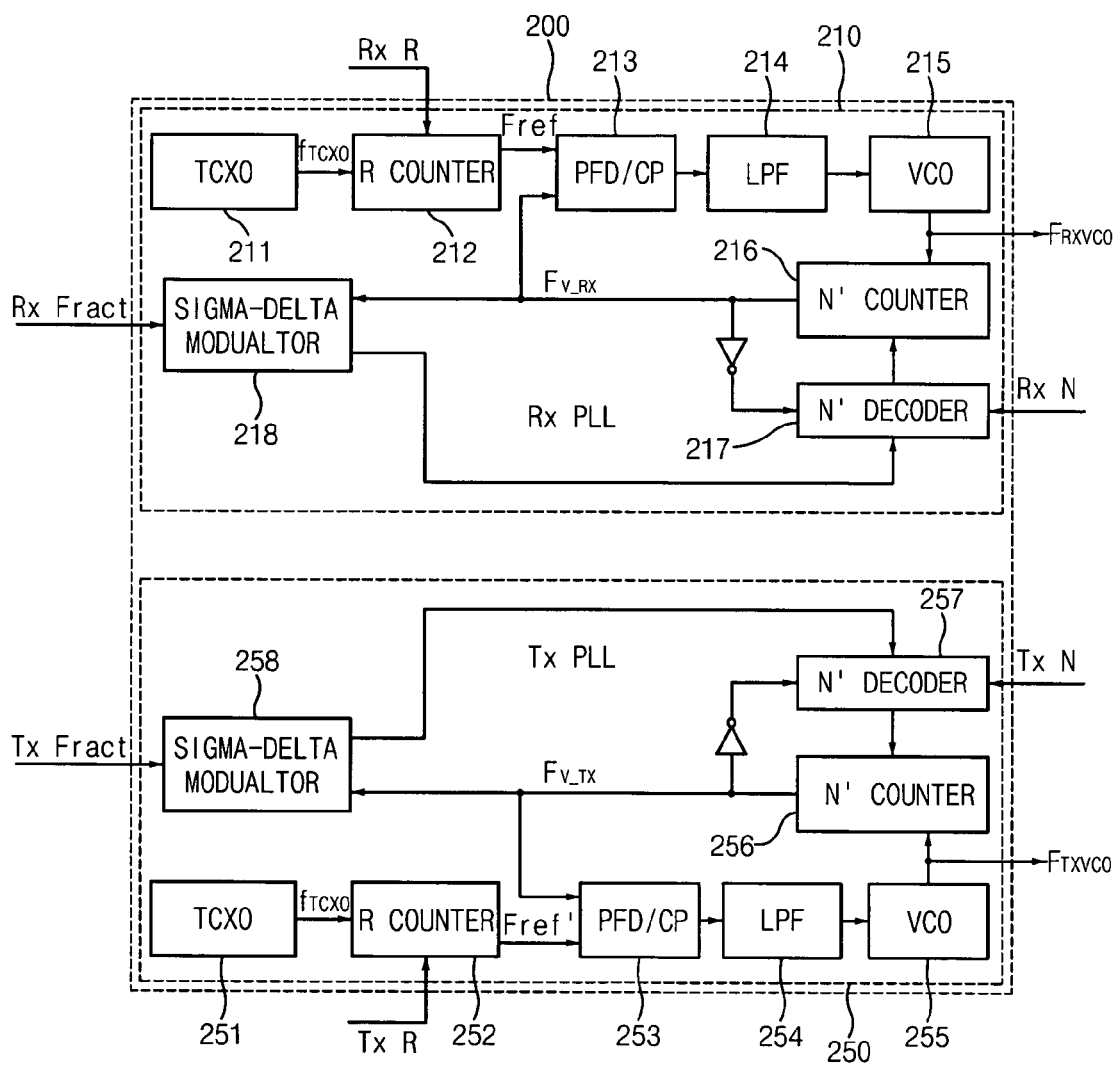
FIG. 2 is a block diagram illustrating a conventional dual-frequency synthesizer using two sigma-delta demodulators.

Referring to FIG. 3, the frequency synthesizer includes a phase-locked loop Rx PLL 310 for a receiving channel and a phase-locked loop Tx PLL 330 for a transmitting channel. Each of the phase-locked loop Rx PLL 310 (for the receiving channel) and the phase-locked loop Tx PLL 330 (for the transmitting channel) have similar configurations as those of the conventional phase-locked loops of the frequency synthesizer of FIG. 2.

The phase-locked loop Rx PLL 310 for the receiving channel includes a phase detector and a charge pump PFD/CP 313, a loop filter (low pass filter, LPF) 314, a voltage controlled oscillator 315, an N' counter (M' Counter) 316 and an N' decoder (M' Decoder) 317. Similarly, the phase-locked loop Tx PLL 330 for the transmitting channel includes a phase detector and a charge pump PFD/CP 333, a loop filter 334, a voltage controlled oscillator 335, an N' counter 336 and an N' decoder 337.

The phase-locked loop Rx PLL 310 for the receiving channel and the phase-locked loop Tx PLL 330 for the transmitting channel, which typically operate independently, share the sigma-delta modulator 320, a temperature compensation crystal oscillator TCXO 311 and an R counter 312 if each integer division ratio (e.g., integers M and N) of the phase-locked loops for the receiving channel and the transmitting channel are designated to satisfy a certain relationship therebetween.

A transmitting channel frequency $f_{TxVCO}$ and a receiving channel frequency $f_{RxVCO}$ may have a relationship as in the following equation 1:

$$f_{RxVCO} = f_{TxVCO} + \Delta f \quad \text{[Equation 1]}$$

As shown in the above equation 1, in the wireless mobile communication, there exists a predetermined frequency difference $\Delta f$ between the transmitting channel frequency and the receiving channel frequency. For example, the frequency of the transmitting channel and the frequency of the receiving channel have predetermined frequency intervals therebetween in a personal communication services (PCS) or a cellular using a code division multiple access (CDMA) technology, which is detailed in the following table 1.

Table 1 shows the channel frequencies used in a CDMA US-PCS communication system.

TABLE 1

| | Channel | Channel frequency (MHz) |
|---|---|---|
| Tx | 0 ≤ Ch ≤ 1199 | 1850.00 + 0.050 · Ch |
| Rx | 0 ≤ Ch ≤ 1199 | 1930.00 + 0.050 · Ch |

As shown in table 1, the mobile device uses a frequency band around 1850 MHz as its transmitting channel frequency and uses a frequency band around 1930 MHz as its receiving channel frequency. Thus, there exists a frequency interval of 80 MHz between the transmitting channel frequency and the receiving channel frequency of the CDMA US-PCS communication system. Namely, the frequency difference $\Delta f$ in the above equation 1 is 80 MHz for a CDMA US-PCS communication system.

For example, in channel 600, the receiving channel frequency of the mobile device is 1960 MHz (=1930.00+0.050×600) and the transmitting channel frequency of the mobile device is 1880 MHz (=1850.00+0.050×600). Thus, a frequency difference between the receiving channel frequency and the transmitting channel frequency is 80 MHz.

Table 2 shows a channel frequency of a CDMA cellular communication system.

TABLE 2

| | Channel | Channel frequency (MHz) |
|---|---|---|
| Tx | 1 ≤ Ch ≤ 777 | 0.030 · Ch + 825.00 |
| | 1013 ≤ Ch ≤ 1023 | 0.030 · (Ch − 1023) + 825.00 |
| Rx | 1 ≤ Ch ≤ 777 | 0.030 · Ch + 870.00 |
| | 1013 ≤ Ch ≤ 1023 | 0.030 · (Ch − 1023) + 870.00 |

As shown in table 2, the mobile device uses a frequency band around 825 MHz as its transmitting channel frequency and uses a frequency band around 870 MHz as its receiving channel frequency. Namely, there exists a frequency difference of 45 MHz between the transmitting channel frequency and the receiving channel frequency in the CDMA cellular communication system. Namely, the frequency difference $\Delta f$ in the above equation 1 is 45 MHz in a CDMA cellular communication system.

For example, in channel 363, the receiving channel frequency of the mobile device is 880.89 MHz (=0.030×363+870.00) and the transmitting channel frequency of the mobile device is 835.89 MHz (=0.030×363+825.00). Thus, a frequency difference between the receiving channel frequency and the transmitting channel frequency is 45 MHz.

In the case of such a CDMA cellular device, an output frequency of the phase-locked loop may be designed to have a frequency twice the channel frequency. This is because, in a heterodyne scheme or direct conversion scheme, the receiving channel frequency and the transmitting channel frequency having twice the channel frequency are generated by the voltage controlled oscillator and each of the receiving and transmitting channel frequencies is divided by 2 to generate an in-phase (I) signal and quadrature-phase (Q) signal.

When the channel 363 is again taken as an example, the receiving channel frequency of a communication device is 880.89 MHz and the transmitting channel frequency is 835.89 MHz. As discussed above, to account for the output frequency of the voltage-controlled oscillator, which is twice the channel frequency, the receiving channel frequency $f_{RxVCO}$ is 1761.78 MHz and the transmitting channel frequency $f_{TxVCO}$ is 1671.78 MHz. Therefore, the frequency difference $\Delta f$ in the above equation 1 is 90 MHz.

As described with respect to the related art, in the fractional-N phase-locked loop, a division rate of the phase-locked loop is represented by a sum of an integer division ratio and a fractional division ratio that is between zero and one. Therefore, the transmitting channel frequency $fT_{xVCO}$ and the receiving channel frequency $f_{RxVCO}$ of the phase-locked loop may be expressed by the following equations 2 and 3, respectively, when the transmitting channel frequency $f_{TxVCO}$ of the phase-locked loop has an integer ratio N and a fractional ratio fracTx and the receiving channel frequency $f_{RxVCO}$ of the phase-locked loop has an integer ratio M and a fractional ratio fracRx.

$$f_{TxVCO} = f_{ref}(N + frac_{tx}) \quad \text{[Equation 2]}$$

$$f_{RxVCO} = f_{ref}(M + frac_{Rx}) \quad \text{[Equation 3]}$$

The equations 2 and 3 may be rewritten with respect to fracTx and fracRx as, $$f\ rac_{Tx} = \frac{f_{TxVCO}}{fref} - N \quad \text{[Equation 4]}$$

-continued $$f\,rac_{Rx} = \frac{f_{RxVCO}}{fref} - M \qquad \text{[Equation 5]}$$

The $f_{RxVCO}$ in the equation 1 is substituted into the equation 5 to produce, $$f\,rac_{Rx} = \frac{f_{TxVCO} + \Delta f}{fref} - M \qquad \text{[Equation 6]}$$

As described above, N and M are integers and fracTx and fracRx have a value between zero and one (e.g., are fractions). To share the sigma-delta modulator in common, the fractional ratio fracTx and the fractional ratio fracRx need to be the same (i.e., fracTx=fracRx). Therefore, based on the above equation 4 and the equation 6, there exists the following relationship as shown in equation 7 so as to satisfy fracTx=fracRx.

$$N = M - \frac{\Delta f}{fref} \qquad \text{[Equation 7]}$$

Since N and M are defined as integers, $\Delta f/fref$ is an integer (L). And, since the reference frequency Fref generated by the R counter 312 has a relationship with a reference oscillation frequency $f_{TCXO}$ of the crystal oscillator 311 such that $$fref = \frac{f_{TCXO}}{R},$$

the expression $\Delta f/fref$ may be rewritten as the following equation 8.

$$\frac{\Delta f}{fref} = \frac{\Delta f \cdot R}{f_{TCXO}} \qquad \text{[Equation 8]}$$

Therefore, by adjusting the division ratio R of the R counter with respect to a given reference oscillation frequency $f_{TCXO}$ of the reference oscillator 311, $\Delta f/fref$ may be set as an integer so that the fractional ratio fracTx of the transmitting channel and the fractional ratio fracRx of the receiving channel have the same value. As a result, the PLLs for both the transmitting channel and the receiving channel may share a common sigma-delta modulator 320.

FIG. 4 is a table showing examples of selected integer divisional ratios N and M and selected fractional divisional ratios (fracTX=fracRx) for use in a CDMA-based US-PCS communication system to generate respective (Tx and Rx) channel frequencies using the relationship between the receiving and transmitting channel frequencies shown in table 1 according to an exemplary embodiment of the invention. In the table of FIG. 4, the integer divisional ratio N and the integer divisional ratio M are determined with the division ratio R of the R counter 312 set to 6 and the reference oscillation frequency $f_{TCXO}$ set to 19.2 MHz.

First, in the CDMA US-PCS communication system where the frequency difference $\Delta f$ between output frequencies of the PLLs for the receiving channel and the transmitting channel is 80 MHz and the reference oscillation frequency $f_{TCXO}$ is 19.2 MHz, a variable L, which denotes $\Delta f/fref$, may be represented by the following equation 9:

$$L = \frac{\Delta f}{fref} = \frac{80\,\text{MHz} \cdot R}{19.2\,\text{MHz}} \qquad \text{[Equation 9]}$$

In order for L to be an integer, a suitable value for R has to be found; for example, if R is 6 then L may have a value of 25. And, since $$fref = \frac{f_{TCXO}}{R},$$

when R is 6, Fref is 3.2 MHz (=19.2/6). In channel 600, for example, the output frequency fRXVCO of the PLL for the receiving channel is 1960 MHz and the output frequency fTXVCO of the PLL for the transmitting channel is 1880 MHz (as calculated using the above table 2), which is shown in the table of FIG. 4. Therefore, the output frequencies fRXVCO and ffXVCO may be expressed by the following equation 10, in relation to the reference frequency Fref, the integer divisional ratio and the fractional divisional ratio using the equations 2 and 3.

1960(MHz)=3.2(MHz)·(612+0.5)

1880(MHz)=3.2(MHz)·(587+0.5)   [Equation 10]

It can be seen from the equation 10 that both the PLLs for the receiving channel and the transmitting channel have the same fractional divisional ratio fracRx and fracTx as 0.5 and the variable R of the R counter is the same as 6. Therefore, (as illustrated in FIG. 3) the sigma-delta modulator 320 and the R counter 312 may be commonly shared for the two PLLs (319 and 330) for the receiving and transmitting channels.

As described above, the integer divisional ratio N and the integer divisional ratio M are given with the variable R set to 6 and the reference oscillation frequency $f_{TCXO}$ set to 19.2 MHz. When the variable R or the frequency $f_{TCXO}$ is changed to have a different value, the integer divisional ratio N and the integer divisional ratio M may yield different values according to the variance of the variable R and the frequency $f_{TCXO}$.

FIG. 5 is a table showing examples of selected integer division ratios N and M and fractional ratios (FracTx=FracRx) employed in a CDMA-based cellular communication system according to an exemplary embodiment of the invention. In the table of FIG. 5, the integer divisional ratio N and the integer divisional ratio M are determined with the division ratio R of the R counter 312 set to 16 and the reference oscillation frequency $f_{TCXO}$ set to 19.2 MHz.

First, since the frequency difference $\Delta f$ in the CDMA cellular device between output frequencies of the PLL for the receiving channel and the PLL for the transmitting channel is 90 MHz and the reference oscillation frequency $f_{TCXO}$ is 19.2 MHz, the variable L may be represented by the following equation 11.

$$L = \frac{\Delta f}{fref} = \frac{90\,\text{MHz} \cdot R}{19.2\,\text{MHz}} \qquad \text{[Equation 11]}$$

In order for L to be an integer, a suitable value of R has to be found; for example, if R is 16 and L has a value of 75. And, since $$f_{ref} = \frac{f_{TCXO}}{R},$$

when R is 16, Fref becomes 1.2 MHz (=19.2/16). In channel 363, for example, the output frequency fRXVCO of the PLL for the receiving channel is 1761.78 MHz and the output frequency fTXVCO of the PLL for the transmitting channel is 1671.78 MHz (as calculated as an example in the table 2), which is shown in the table of FIG. 5. Therefore, the output frequencies fRXVCO and fTXVCO of the PLLs for the receiving and transmitting channels may be expressed by the following equation 12 in relation to the reference frequency Fref, the integer divisional ratio and the fractional divisional ratio using the equations 2 and 3.

$$1761.78(MHz) = 1.2(MHz) \cdot (1468 + 0.15)$$

$$1671.78(MHz) = 1.2(MHz) \cdot (1393 + 0.15) \quad \text{[Equation 12]}$$

It can be seen from the equation 12 that both the PLLs for the receiving channel and the transmitting channel have the same fractional divisional ratio (fracRx and fracTx equal to 0.15) and the variable R of the R counter is 16. Therefore, the sigma-delta modulator and the R counter may be commonly shared for the PLLs for the receiving and transmitting channels.

As described above, the integer divisional ratio N and the integer divisional ratio M of the table in FIG. 5 are given with the variable R set to 6 and the frequency $f_{TCXO}$ set to 19.2 MHz. When the variable R or the frequency $f_{TCXO}$ is changed to have a different value, the integer divisional ratio N and the integer divisional ratio M may yield different values according to the variance of the variable R and the frequency FTCXO.

Figure 6:
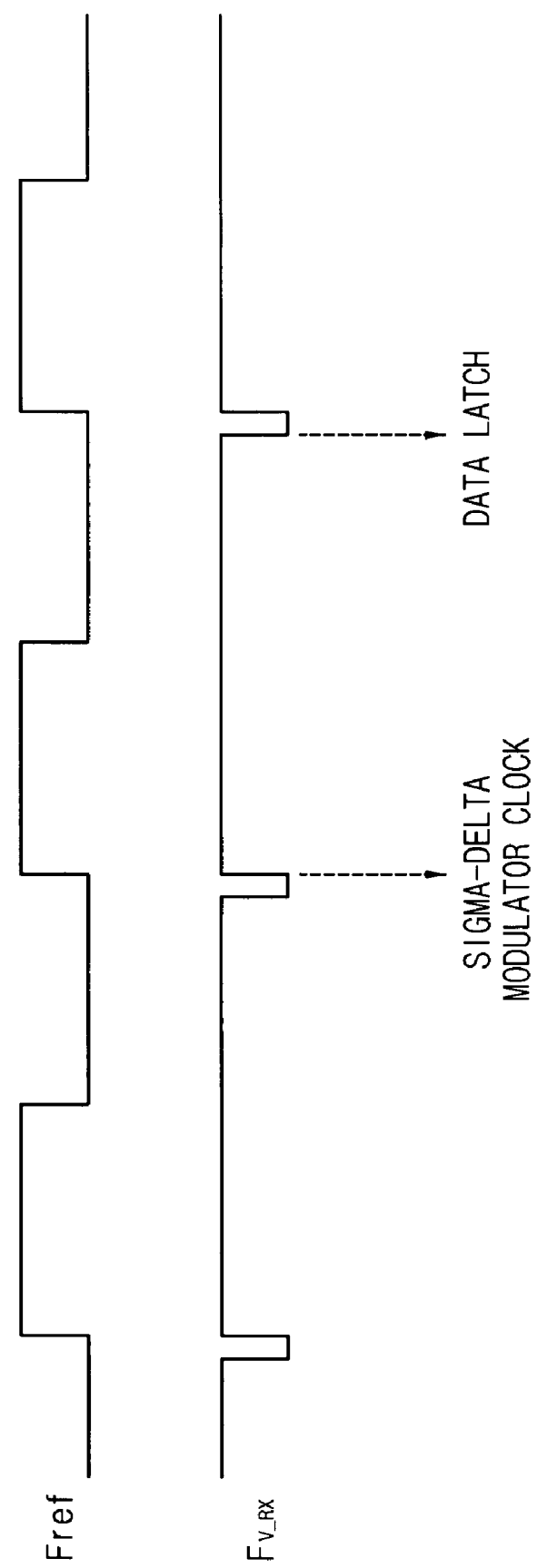
FIG. 6 is a timing diagram illustrating a signal of the shared sigma-delta demodulator of the frequency synthesizer of FIG. 3.

FIG. 6 is a timing diagram illustrating a signal of a sigma-delta demodulator of the (dual) frequency synthesizer of FIG. 3.

Signal Fref in FIG. 6 is a reference frequency (clock) outputted by the R counter (312 in FIG. 3). The reference frequency signal Fref has a duty cycle of 50% and (as illustrated in FIG. 3) is commonly applied to the PLL 330 for the transmitting channel and to the PLL 310 for the receiving channel. The reference frequency signal Fref is provided to the PLL 310 for the receiving channel, and is passed through an inverter 321 in FIG. 3 for input as an inverted reference frequency signal to the PLL 330 for the transmitting channel. The inverter 321 is used to reduce digital noise.

Figure 1:
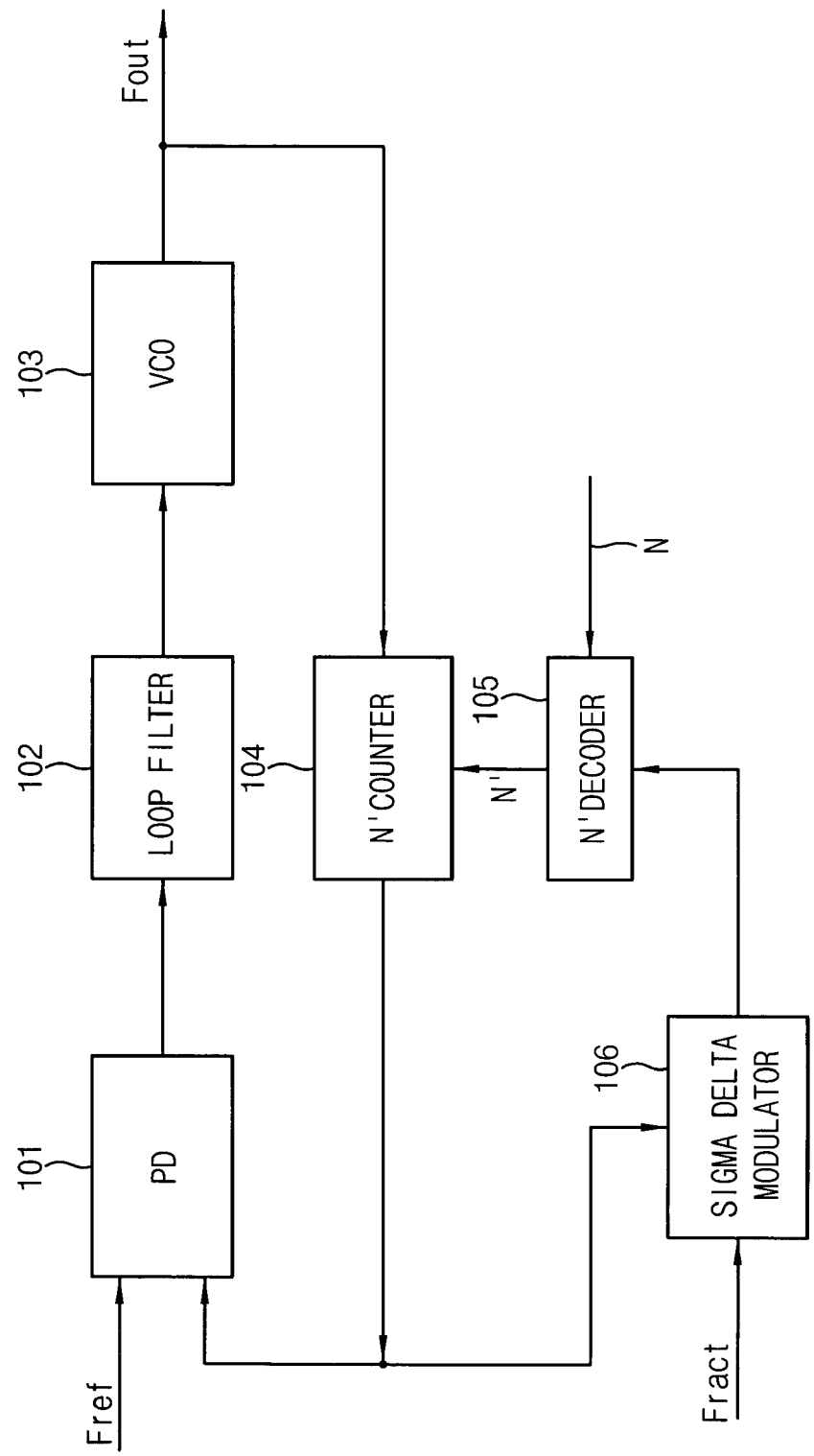
FIG. 1 is a block diagram illustrating a conventional fractional phase-locked loop.

The signal FV_RX in FIGS. 3 and 6 is an output clock of an N' counter (M' Counter) 316 included in the PLL 310 for a receiving channel (see FIG. 1). The sigma-delta modulator 320 operates in synchronization with each rising edge of the signal FV_RX, and performs a data latch in response to each falling edge of the signal FV_RX.

Figure 7:
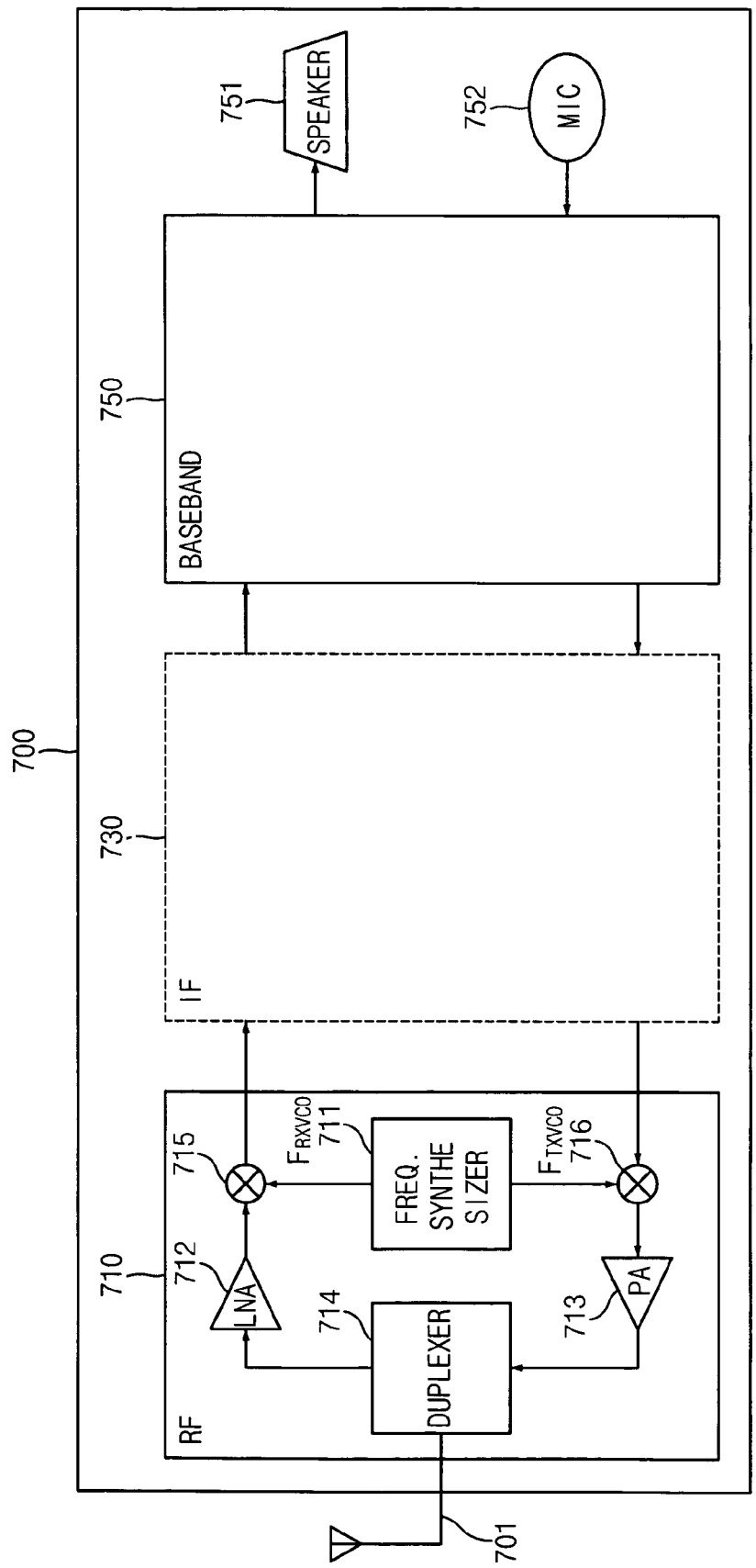
FIG. 7 is a block diagram illustrating a (wireless, mobile) communication device incorporating the frequency synthesizer of FIG. 3.

FIG. 7 is a block diagram illustrating a communication device (e.g., a wireless, mobile communication device, such as a cell phone) incorporating the (dual) frequency synthesizer of FIG. 3.

The communication device 700 in FIG. 7 includes an RF sub system 710, an IF sub system 730 and a baseband sub system 750. In a direct conversion scheme, the IF sub system 730 may be omitted from the wireless mobile device 700. A (dual) frequency synthesizer 711 according to an exemplary embodiment of the invention, included in the RF sub system 710, may be used to demodulate a first RF signal at a mixer 715, which is received through an antenna 701 and passed through a low noise amplifier (LNA) 712. Also, the frequency synthesizer 711 may be used to synthesize a carrier for modulating a second RF signal, at a mixer 716, which is to be transmitted through a power amplifier 713.

In case of a heterodyne receiver, the first RF signal demodulated by the RF sub system 710 (at mixer 712) is transmitted to the baseband sub system 750 via the IF sub system 730. In a direct conversion receiver, the first RF signal demodulated by the RF sub system 710 (at mixer 712) is directly inputted to the baseband sub system 750. Signal processing is performed on the demodulated first RF signal to output the signal-processed first RF signal through a speaker 751 as audible sound.

Conversely, in a transmitting channel, a voice signal inputted at a microphone MIC 752 is signal processed by the baseband sub system 750 and transmitted to a mixer 716 in the RF sub subsystem 710 either directly or via the IF sub system 730.

The frequency synthesizer 711 according to an exemplary embodiment of the invention may be configured on a separate chip. However, the frequency synthesizer 711 is generally included in one chip or one of a chip set configuring the wireless mobile communication device.

In other exemplary embodiments of the invention, in a frequency synthesizer using a fractional-N phase-locked loop, the fractional division ratios of the transmitting channel and the receiving channel are adjusted to be the same (e.g., at a predetermined fixed values based upon the standard channel frequencies), while varying the integer division ratios so that the R counter and the sigma-delta modulator, which occupies a relatively large area, may be shared by the PLLs for the transmitting channel and the receiving channel. Therefore, the chip area of the dual frequency synthesizer may be reduced.

In other exemplary embodiments of the invention, a frequency synthesizer may comprise a plurality greater than two (e.g., 3) of fractional-N phase-locked loops capable of outputting different frequencies while sharing one sigma-delta modulator.

Having thus described exemplary embodiments of the invention, it is to be understood that the invention defined by the appended claims is not to be limited by particular examples and details set forth in the above description as many apparent variations thereof are possible without departing from the spirit or scope thereof as hereinafter claimed.

What is claimed is:

1. A frequency synthesizer comprising:
    a first fractional-N phase-locked loop (PLL) configured to generate a first frequency clock based on a reference frequency clock; and
    a second fractional-N phase-locked loop configured to generate a second frequency clock based on the reference frequency clock;
    wherein the first and second fractional-N phase-locked loops share a common sigma-delta modulator.

2. The frequency synthesizer of claim 1, further comprising a reference oscillator configured to generate a reference oscillation frequency clock; and
    an R counter configured to output the reference frequency clock based on the reference oscillation frequency clock.

3. The frequency synthesizer of claim 2, wherein the first and second PLLs have substantially the same fraction ratio, and are adapted to satisfy the following relationship:

$$\frac{\Delta f}{fref} = L,$$

wherein L is an integer, Δf denotes a frequency difference between an output frequency of the first PLL and an output frequency of the second PLL, and Fref denotes the reference frequency.

4. The frequency synthesizer of claim 3, wherein the count value of the R counter and the reference oscillation frequency satisfy the following relationship:

$$\frac{\Delta f \cdot R}{f_{TCXO}} = L$$

wherein R denotes the count value of the R counter and $f_{TCXO}$ denotes the reference oscillation frequency.

5. The frequency synthesizer of claim 4, wherein the frequency synthesizer is adapted for a CDMA US-PCS transceiver and the count value of the R counter is 6 and the reference oscillation frequency of the reference oscillator is about 19.2 MHz.

6. The frequency synthesizer of claim 4, wherein the frequency synthesizer is adapted for a CDMA cellular transceiver and the count value of the R counter is 16 and the reference oscillation frequency of the reference oscillator is about 19.2 MHz.

7. The frequency synthesizer of claim 1, wherein the first fractional-N phase-locked loop (PLL) is for a receiving channel; and wherein the second fractional-N phase-locked loop (PLL) is for a transmitting channel.

8. The frequency synthesizer of claim 1, further comprising an inverter configured to invert the reference frequency clock, wherein the reference frequency clock is provided to one of the first and second fractional-N phase-locked loops, and the inverted clock is provided to the other one of the first and second fractional-N phase-locked loops.

9. The frequency synthesizer of claim 1, wherein the output frequency of the first fractional-N phase-locked loop is expressed by the following equation:

$$f_{RxVCO} = f_{ref} \cdot (M + frac_{Rx}),$$

wherein $f_{RxVCO}$ denotes the output frequency of the first phase-locked loop, Fref denotes the reference frequency, M denotes an integer and fracRx denotes a fraction;

wherein the output frequency of the second fractional-N phase-locked loop is expressed by the following equation:

$$f_{TxVCO} = f_{ref} \cdot (N + frac_{Tx}),$$

wherein $f_{TxVCO}$ denotes the frequency output by the second phase-locked loop, Fref denotes the reference frequency, N denotes an integer and fracTx denotes a fraction; and wherein the fraction fracRx of the first PLL is substantially the same as the fraction fracTx of the second PLL.

10. A communication device having a frequency synthesizer comprising:
an R counter configured to output a reference frequency clock based on a reference oscillation frequency clock;
a first fractional-N phase-locked loop (PLL) configured to generate a first frequency clock based on the reference frequency clock; and a second fractional-N phase-locked loop configured to generate a second frequency clock based on the reference frequency clock;
wherein the first and second fractional-N phase-locked loops share a common sigma-delta modulator.

11. The communication device of claim 10, wherein the frequency synthesizer further includes an inverter configured to invert the reference clock outputted from the R counter, and wherein the reference clock is provided to one of the first and second fractional-N phase-locked loops and the inverted reference clock is provided to the other one of the first and second fractional-N phase-locked loops.

12. The communication device of claim 10, wherein a division ratio of the first fractional-N phase-locked loop is expressed by the following equation:

$$f_{RxVCO} = f_{ref} \cdot (M + frac_{Rx}),$$

wherein $f_{RxVCO}$ denotes the output frequency of the first phase-locked loop, Fref denotes the reference frequency, M denotes an integer and fracRx denotes a fraction;

wherein a division ratio of the second fractional-N phase-locked loop is expressed by the following equation:

$$f_{TxVCO} = f_{ref} \cdot (N + frac_{Tx}),$$

wherein $f_{TxVCO}$ denotes the output frequency of the second phase-locked loop, Fref denotes the reference frequency, N denotes an integer and fracTx denotes a fraction; and wherein the fraction (fracRx) of the first PLL is substantially the same as the fraction (fracTx) of the second PLL.

13. The communication device of claim 10, wherein the first and second PLLs have substantially the same fractional ratio and satisfy the following relationship:

$$\frac{\Delta f}{fref} = L,$$

wherein L is an integer, Δf denotes a frequency difference between the output frequency of the first PLL and the output frequency of the second PLL, and Fref denotes the reference frequency.

14. The communication device of claim 13, wherein the count value of the R counter and the reference oscillation frequency satisfy the following relationship:

$$\frac{\Delta f \cdot R}{f_{TCXO}} = L,$$

wherein R denotes the R count value and $f_{TCXO}$ denotes the reference oscillation frequency.

15. The communication device of claim 10, wherein the communication device is adapted to be used in a CDMA-based PCS communication system.

16. The communication device of claim 10, wherein the frequency synthesizer included in the communication device has a count value of the R counter of 6 and the reference oscillation frequency of the reference oscillator of about 19.2 MHz.

17. The communication device of claim 10, wherein the communication device is adapted to be used in a CDMA-based cellular communication system.

18. The communication device of claim 17, wherein the frequency synthesizer included in the communication device has a count value of the R counter of 16 and the reference oscillation frequency of the reference oscillator of about 19.2 MHz.

19. A method of synthesizing two frequencies comprising:
generating a first frequency based on a reference frequency clock, a first fractional division ratio and a first integer division ratio; and
generating a second frequency based on the reference frequency clock, a second fractional division ratio and a second integer division ratio;
wherein the first fractional division ratio is substantially the same as the second fraction division ratio.

20. The method of claim 19, wherein the first and second frequencies satisfy the following relationship:

$$\frac{\Delta f}{f_{ref}} = L,$$

wherein L is an integer, Δf denotes a frequency difference between the first frequency and the second frequency, and Fref denotes the reference frequency.

21. The method of claim 20, further comprising generating the reference frequency based on a reference oscillation frequency clock and a count value,
wherein the reference oscillation frequency and the count value satisfy the following relationship:

$$\frac{\Delta f \cdot R}{f_{TCXO}} = L,$$

wherein R denotes the count value, and $f_{TCXO}$ denotes the reference oscillation frequency.

22. The method of claim 21, wherein the count value is 6 and the reference oscillation frequency is about 19.2 MHz.

23. The method of claim 21, wherein the count value is 16 and the reference oscillation frequency is about 19.2 MHz.

24. A fractional-N frequency synthesizer comprising:
an oscillator;
a counter configured to generate a reference frequency based on a first integer division ratio data and an output frequency clock of the oscillator;
a sigma-delta modulator configured to generate an add/subtract signal based on a fractional division ratio data;
a first fractional-N phase-locked loop (PLL) configured to generate a first frequency based on the reference frequency clock, a second integer division ratio data and the add/subtract signal; and
a second fractional-N phase-locked loop (PLL) configured to generate a second frequency based on the reference frequency clock, a third integer division ratio data and the add/subtract signal;
wherein the second frequency has a predetermined frequency difference from the first frequency.

25. The fractional-N frequency synthesizer of claim 24, wherein the fractional division ratio data is based upon the first integer division ratio data.

26. The fractional-N frequency synthesizer of claim 24, further comprising an inverter configured to invert the reference frequency clock, wherein the reference frequency clock and the inverted clock are provided complimentarily to the first and second fractional-N PLLs to reduce digital noise.

27. The fractional-N frequency synthesizer of claim 24, wherein the first fractional-N phase-locked loop (PLL) includes:
a phase detector/charge pump configured to generate a phase detection signal based on the reference frequency clock and an internal clock;
a loop filter configured to generate a control voltage signal based on the phase detection signal;
a voltage controlled oscillator configured to generate the first frequency clock based on the control voltage signal;
a decoder configured to generate an integer division ratio based on the second integer division ratio data and the add/subtract signal; and
a counter configured to generate the internal clock based on the first frequency clock and the integer division ratio of the decoder, wherein the sigma-delta modulator is synchronized with the internal clock.

* * * * *